US009804622B2

(12) United States Patent
Berard

(10) Patent No.: US 9,804,622 B2
(45) Date of Patent: Oct. 31, 2017

(54) CALIBRATION OF CURRENT SENSORS IN PARALLEL POWER CONVERTERS

(75) Inventor: Olivier Berard, Voreppe (FR)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 636 days.

(21) Appl. No.: 14/370,821

(22) PCT Filed: Jan. 5, 2012

(86) PCT No.: PCT/IB2012/000250
§ 371 (c)(1),
(2), (4) Date: Nov. 7, 2014

(87) PCT Pub. No.: WO2013/102784
PCT Pub. Date: Jul. 11, 2013

(65) Prior Publication Data
US 2015/0061392 A1    Mar. 5, 2015

(51) Int. Cl.
| H02J 3/46 | (2006.01) |
| G05F 1/625 | (2006.01) |
| G01R 31/42 | (2006.01) |
| G01R 35/00 | (2006.01) |
| H02M 7/493 | (2007.01) |
| H02J 9/06 | (2006.01) |

(52) U.S. Cl.
CPC ............ G05F 1/625 (2013.01); G01R 31/42 (2013.01); G01R 35/005 (2013.01); H02J 9/062 (2013.01); H02M 7/493 (2013.01); *H02J 3/46* (2013.01); *Y10T 307/549* (2015.04)

(58) Field of Classification Search
CPC ....... G05F 1/625; G01R 31/42; G01R 35/005; H02J 9/062; H02J 3/46; H02M 7/493; Y10T 307/549
USPC .......................................................... 307/52
See application file for complete search history.

(56) References Cited

U.S. PATENT DOCUMENTS

2005/0043859 A1   2/2005  Tsai et al.
2007/0200538 A1   8/2007  Tang et al.
(Continued)

FOREIGN PATENT DOCUMENTS

| JP | 2007254095 A | 10/2007 |
| WO | 2010045965 A1 | 4/2010 |

OTHER PUBLICATIONS

International Search Report and Written Opinion dated Jan. 9, 2013 for PCT/IB2012/000250.

*Primary Examiner* — Hal Kaplan
(74) *Attorney, Agent, or Firm* — Lando & Anastasi, LLP

(57) ABSTRACT

An uninterruptible power supply (UPS) system (100) comprises a plurality of UPS units (UPS-1, UPS-2) connected in parallel. The controllers (130) of the units are programmed to implement a voltage calibration procedure and a current calibration procedure, in order that measurements of voltage and current made by sensors within the different units will agree. In the current calibration procedure, the load is disconnected (302) while one of the units is selected as a master and operates in a voltage control mode (VCM) (Steps 304-308). Each other unit is selected in turn and operated in a current control mode (310, 312). Current measurements made in the master unit are communicated (314) via a data bus to the selected unit and compared (316) with measurements made in the unit itself. The unit adapts its current sensing gains to match the master unit.

21 Claims, 4 Drawing Sheets

(56) References Cited

U.S. PATENT DOCUMENTS

2010/0013307 A1 1/2010 Heineman et al.
2010/0141230 A1 6/2010 Lucik et al.

CALIBRATION OF CURRENT SENSORS IN PARALLEL POWER CONVERTERS

FIELD

The invention relates generally to methods and apparatus for controlling power supplies. Such power converters may operate for example in an uninterruptible power supply (UPS) system. The invention is particularly concerned with the calibration of current measurements between power supply units operating in parallel.

BACKGROUND

Power supply units of various kinds are known. In each unit, sensors may be provided for measuring currents and/or voltages to allow feedback control of the unit and achieved desired supply conditions. One type of power supply unit is an uninterruptible power supply (UPS) for conditioning and safeguarding electric supplies to sensitive or critical equipment. A common use for UPS systems is in data centers. To increase capacity and security of supply, UPS units can be connected in parallel, so that a current supplied to a load is the sum of currents supplied by a number of UPS units. In order for the UPS units to perform satisfactorily in parallel operation, accurate measurement of current and voltage is required, so that each measures the same value for an equal voltage.

In order for the measurements to be calibrated accurately, conventional units require manual calibration procedures, for example using a computer and multimeter. Automated calibration procedures would be advantageous. However, although it is relatively easy to provide automatic calibration of voltage measurements between parallel-connected power supplies, procedures for automatic calibration of current measurements are not known.

SUMMARY

According to a first aspect of the invention, there is provided a method for controlling a number of power supply units that are arranged for operation in parallel to supply a total electric current to a load, each power supply unit including at least one current sensor for measuring a current supplied by the unit, and a feedback controller for using the measured current during said parallel operation and controlling the unit to maintain a desired condition of supply, wherein a current calibration procedure performed prior to said parallel operation comprises:
(a) operating a selected one of said power supply units as a secondary supply in parallel connection with a primary power supply, while both are disconnected from said load;
(b) operating said current sensor in the selected power supply unit to measure current flowing in said secondary supply;
(c) receiving information of current flowing in said primary supply measured by a primary current sensor outside the selected power supply unit; and
(d) calibrating the current measurement in the selected power supply unit against the primary current sensor, on the basis that said current in the primary supply is equal and opposite to the current flowing in the secondary supply.

Said current calibration procedure may be performed for a plurality of power supply units, each being selected in turn to operate as said secondary supply. In such an embodiment, said primary supply and primary current sensor may be the same for all the selected power supply units.

For the performance of said current calibration procedure, said primary supply can be another one of said power supply units, operating in a voltage control mode. Alternatively, said primary supply may be an external supply.

In an embodiment, for the performance of said current calibration procedure, the selected power supply unit is operated in a current control mode, and may be controlled in said current control mode to act as a pure reactance.

The current calibration procedure can be performed automatically by co-operation of the controllers in the plurality of power supply units.

The invention further provides a power supply unit suitable for operation in parallel with one or more power supply units to supply a total electric current to a load, said power supply unit including at least one current sensor for measuring a current supplied by the unit, and a feedback controller for using the measured current during said parallel operation and controlling the unit to maintain a desired condition of supply, wherein said controller is further arranged to perform a current calibration procedure performed prior to said parallel operation by:
(a) operating the power supply unit as a secondary supply in parallel connection with a primary power supply external to the power supply unit, while both are disconnected from said load;
(b) operating said current sensor in the power supply unit to measure current flowing in said secondary supply;
(c) receiving information of current flowing in said primary supply measured by a primary current sensor outside the power supply unit; and
(d) calibrating the current measured in the power supply unit against the primary current sensor, on the basis that said current in the primary supply is equal and opposite to the current flowing in the secondary supply.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the art based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings.

DETAILED DESCRIPTION

Parallel UPS System Background

Figure 1:
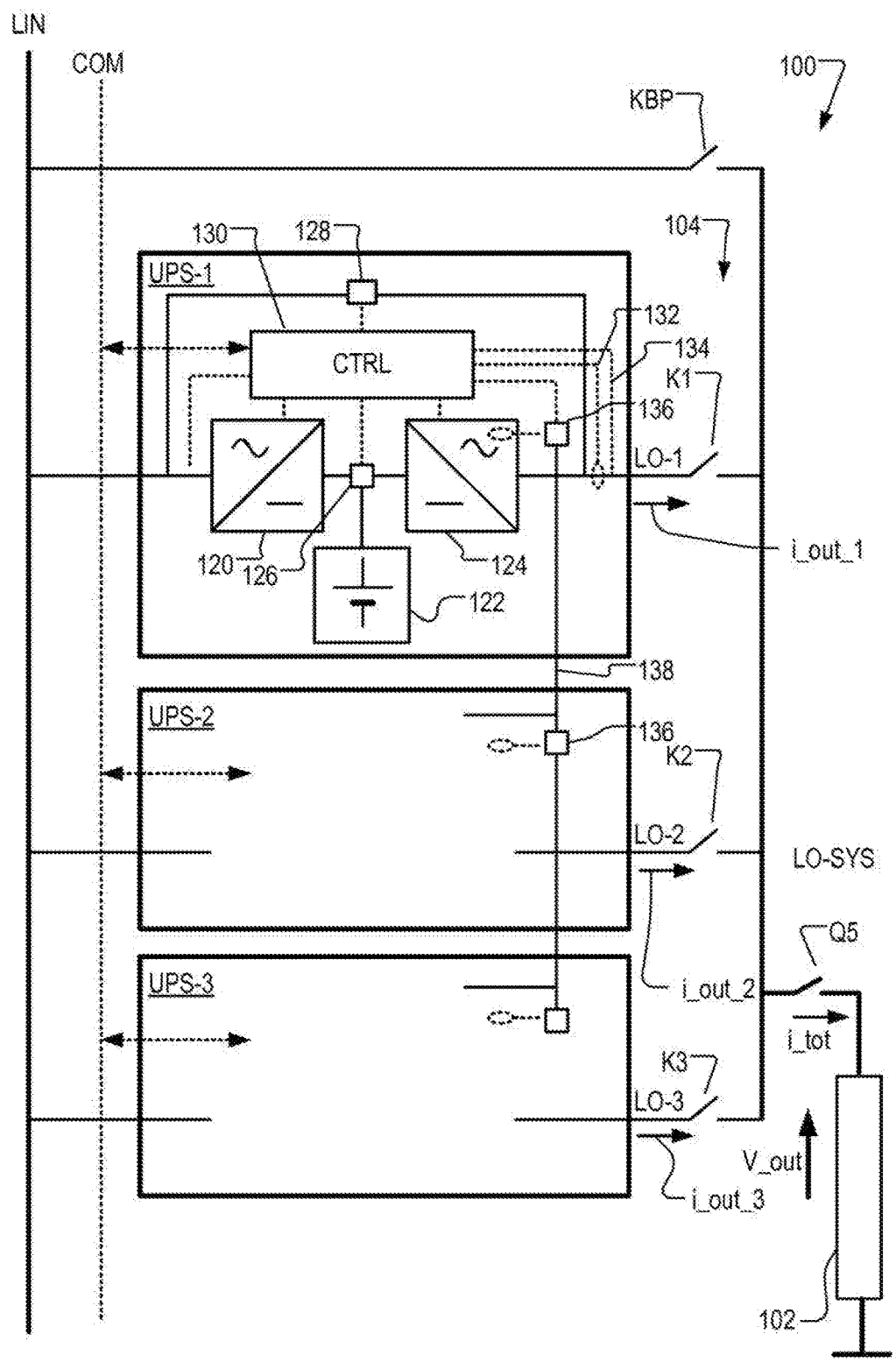
FIG. 1 is a schematic block diagram of an uninterruptable power supply (UPS) system, in which various UPS units are connectable in parallel to supply a shared load.

FIG. 1 illustrates an uninterruptable power supply (UPS) system 100 for delivering a reliable and consistent power supply to a load 102. Load 102 may, for example, comprise an IT system of server computers, communications units and the like, such as would be found in a modern data centre, but the invention is not limited to such applications. The UPS system receives mains electric power through a supply illustrated generally as an input bus LIN (live in). A number of UPS units UPS-1, UPS-2 etc are connected to receive the incoming mains supply, and to generate individual outgoing supplies LO-1, LO-2 etc (live out). The live out connections from the individual UPS units are connected in parallel through a switch network 104 to drive the system live output LO-SYS. Switch network 104 comprises individual switches K1, K2 etc for connecting or disconnecting individual UPS outputs from the system output. Another switch Q5 is provided for connecting or disconnecting the system output to load 102. The live in and live out connections are shown as single lines in the diagram, but in reality each may comprise two or more lines. In a single-phase installation, the live out connection may comprise live and neutral lines. In a 3-phase system, each outgoing supply connection LO-1 etc. could be 3 live wires, and optionally a neutral connection. These details are very familiar to the skilled person and do not need to be explained herein.

Optionally, a global bypass line is provided, with a switch KBP, for connecting the system live output LO-SYS directly to the input bus LIN.

Within the first UPS unit, UPS-1, there are shown some schematic details of the major components of a typical UPS. The other UPS units may have similar form, and their internal detail is not shown, for simplicity. As is generally known, a typical UPS unit comprises an AC-DC converter 120, a DC battery 122 and a DC-AC converter 124. DC-AC converter 124 in practice may comprise a DC-DC converter (not shown separately) to convert from battery voltage to a higher, main voltage, and then a DC-AC converter. Converter 120 receives power from the live input and converts it for use charging the battery 122. Battery 122 stores energy for use in case of power interruption at the input side, and converter 124 converts and conditions energy from the battery to drive the live output LO-1. The battery 122 and converter 124 may be controlled to be operational only in the event of power failure at the input side, or they may be used continuously to provide an output supply that is more highly conditioned than the input supply. Various interconnections with switches 126, 128 are provided and the whole unit is under control of a controller 130.

Controller 130 will typically comprise digital signal processing circuits (DSPs), one or more micro controllers and/or digital circuits implemented for example by FPGA devices. Each converter 120, 124 comprises in practice numerous power switches that are operated in rapid sequence to convert voltages to different levels, and from DC to AC. All of these are well known functions in the art. A little more detail will be described below, with reference to FIG. 2. To perform its operation, controller 130 is also connected to numerous sensing circuits for measuring currents, voltages, temperatures and the like throughout the system. A few examples are illustrated in dotted lines. Currents can be sensed by current transformers and the sensing circuit for an output current of UPS-1 is indicated at 132, by way of example and sensing for an output voltage at 134. The current flowing out of UPS-1 may be measured and labeled i_out_1, and measured by sensor 132. Other currents and voltages within the system can be measured likewise. The output current of the second UPS, UPS-2, can similarly be labeled i_out_2. Between the controllers of the various UPS units, a communications bus COM is provided, that can be used as a communications link for supervision purposes, as is well known. While a wired communication bus is shown, this communication link can be provided by wireless means, if desired.

For operation in parallel, some cooperation is required between the controllers of the various UPS units, to ensure that they share the load evenly, and do not end up driving one another unnecessarily. In accordance with an embodiment of another invention, described in our co-pending application (Applicant's ref APC-0414), not published at the present filing date, the controllers 130 in the UPS units UPS-1, UPS-2 etc can be arranged so as to supply a share of the current to load 102 that is proportionate to their individual power ratings. That is to say, if all the UPS units in system 100 have identical power ratings, then each will supply an equal share of the total current i_tot. On the other hand, if different UPS units have different power ratings, each will supply a share of the total current, in proportion to its power rating. This is not a feature of known UPS units, even when they are designed to be connected in parallel. For the purposes of the present disclosure, it can simply be assumed that all units have the same power capacity and all are controlled to deliver an equal share of current.

Figure 2:
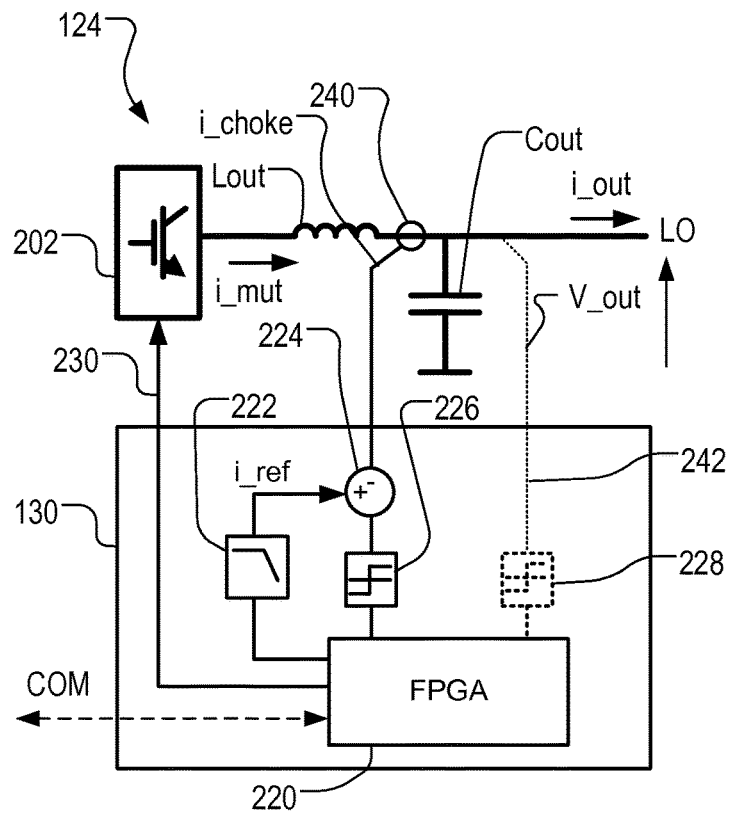
FIG. 2 illustrates some key components in a power converter within one of the UPS units of the system in FIG. 1.

In order to control the sharing of the load current, it is not necessary to measure directly the total current i_tot flowing to the load, although of course this may be measured and monitored by an overall system controller (not shown). Rather, in the present example, each UPS unit includes a dedicated module 136 that measures currents within the unit, and is interconnected by an analog bus 138 with similar modules 136 in each of the UPS devices collected in parallel. The purpose of the module 136 is to supply to the controller 130 a value for an "exchange current", that can be used by the controller in each unit, to assist in load sharing. The skilled reader will appreciate that there are many different ways of controlling UPS units in parallel. The use of exchange current is described here only as one example. Other methods used in commercial systems are for example as "droop control", or "master/slave controls". These other control method may not require bus 138 and modules 136, and may operate only through digital communication bus COM. The exchange current, as its name implies, is a portion of the output current i_out_1, i_out_2 or i_out_3 that is not being delivered to the overall system load 102, but is effectively being exchanged between the parallel UPS units. The measured exchange current is used as an input variable in the controller of each UPS unit. FIG. 2 illustrates in schematic detail the internal construction of converter 124 in one of the UPS units UPS-1, including exemplary sensing and control functions. Each UPS unit has its own output voltage v_out. One exemplary "arm" or "leg" of converter 124 is illustrated, in which power switches 202 are provided at the high side and low side of an output line. These switches, which may be referred to collectively as a mutator, connect the output line alternately to high- and low-side DC supplies (not shown), so as to generate a desired AC output waveform on the output line LO. The mutator output will typically feed an output capacitor Cout, via an output inductance Lout. The UPS output current i_out is drawn from the output capacitor, and is a smoothed version of the mutator output current i_mut. Controller 130 is also partially illustrated which includes for example an FPGA circuit 220 and various signal processing functions 222-228 implemented in a combination of analog circuitry and DSP form. Analog to digital conversion is not explicitly shown, but is of course implemented as required. FPGA implements various control sequences to generate switch commands 230 for switches 202.

In the example of FIG. 2, a current sensor (current transformer) 240 senses current flowing in the output line LO between the inductor Lout and output capacitor Cout. An analog reference is generated at 222 and the sensed current is compared (subtracted) from the current reference at 224. The current difference is passed to function 226 which detects zero crossings and reports them to FPGA circuit 220. A voltage sensor 242 is connected to measure the output voltage v_out and this also is passed to function 228 which detects zero crossings and reports them to FPGA circuit 220.

Figure 3:
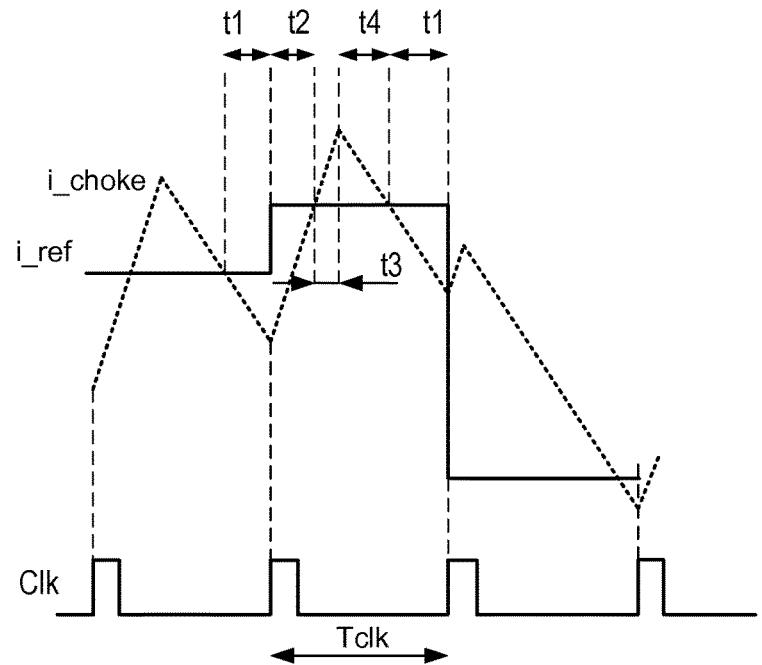
FIG. 3 illustrates waveforms in the circuit of FIG. 2.

In the waveform diagram of FIG. 3, some details of operation of the FIG. 2 circuit can be seen. The measurements described and the operation of the switches form part of a feedback control loop that is established and operated by controller 130 to ensure the desired operation of the power converter 124 and the UPS unit as a whole. The complete operation is extremely complex and only a small part of it is shown here. It can be seen for example that waveform of the sensed current i_choke rises and falls, depending on the state of switches 202 controlled by commands 230. A current reference level i_ref is generated, which changes at certain intervals dictated by a clock waveform Clk with period Tclk. As i_choke varies and from time to time crosses the value i_ref, a zero crossing signal is generated by function 226. Each clock cycle period Tclk is divided into intervals t1, t2, t3 and t4 by the operation of the switches and by the detected zero crossings.

As mentioned already, the exact method of control of the power converters in each unit is not material to the present invention. Different control methods will rely on measurement of current at a different point or points in the overall circuit. Whether the controller uses measurement of i_choke, i_mut, i_out or all of them, calibration of the current measurement between units can be important to allow the desired control performance of the units operating in parallel. In a real embodiment, these various currents will also be sensed, to allow for different modes of control and monitoring to be implemented, and the calibration procedures described below will be repeated for each sensed current.

In a 3-phase converter, at least three switch legs 202 will be provided for driving the three live outputs, and an additional leg (mutator) may be provided for driving an internal neutral line, to which the individual output capacitors are connected in a star topology. The exact construction of the UPS is not relevant to the present invention, but it is useful to recognize that measurements of current for a UPS may be made not at the final output i_out, but at some earlier part of the circuit. It should also be remembered that measurements and control functions can be implemented independently for each phase of a multi-phase output.

Initialization with Automatic Calibration of Voltage & Current Measurements

For correct operation of several UPS units in parallel, each UPS measures output voltage (V_out) and output current (i_out), and/or variants of these are measured at points internal to the UPS unit, as already mentioned. These are compared to a reference in a control algorithm (commonly to monitor parameters such as Droop, Exchange Current or Reference Distribution) and the operation is modified so that the output meets the reference. If the measurement is inaccurate in any UPS, for example due to analogue component tolerances, then the V_out and i_out will be incorrect leading to unequal power distribution between UPS units. As a manual calibration is not always possible on system installation, and is inconvenient in any event, it is desired to have an automatic way to realize the current and voltage calibration. The following description gives some ways to realize that auto-calibration without external test equipment.

Referring again to FIG. 1, when the switches K1 and K2 are closed then at least units UPS-1 and UPS-2 are connected in parallel. The voltage V_out for each UPS is therefore known to be the same. It is known to use this common voltage to calibrate the voltage sensing arrangements in each UPS units. For this purpose, each is operated in voltage control mode. Using the communication bus COM, it is possible to compare automatically the V_out measurement within unit UPS-1 with the V_out measurement of unit UPS-2. As the voltages are the same, any difference is due to measurement inaccuracy. The measurement gain of the sensing arrangement (DSP or the like) in UPS-2 can therefore be adjusted such that the measurement is equal to that of UPS-1. However, the current i_out is not always the same for each UPS unit and so the above simple method cannot be used to calibrate current measurement.

Figure 4:
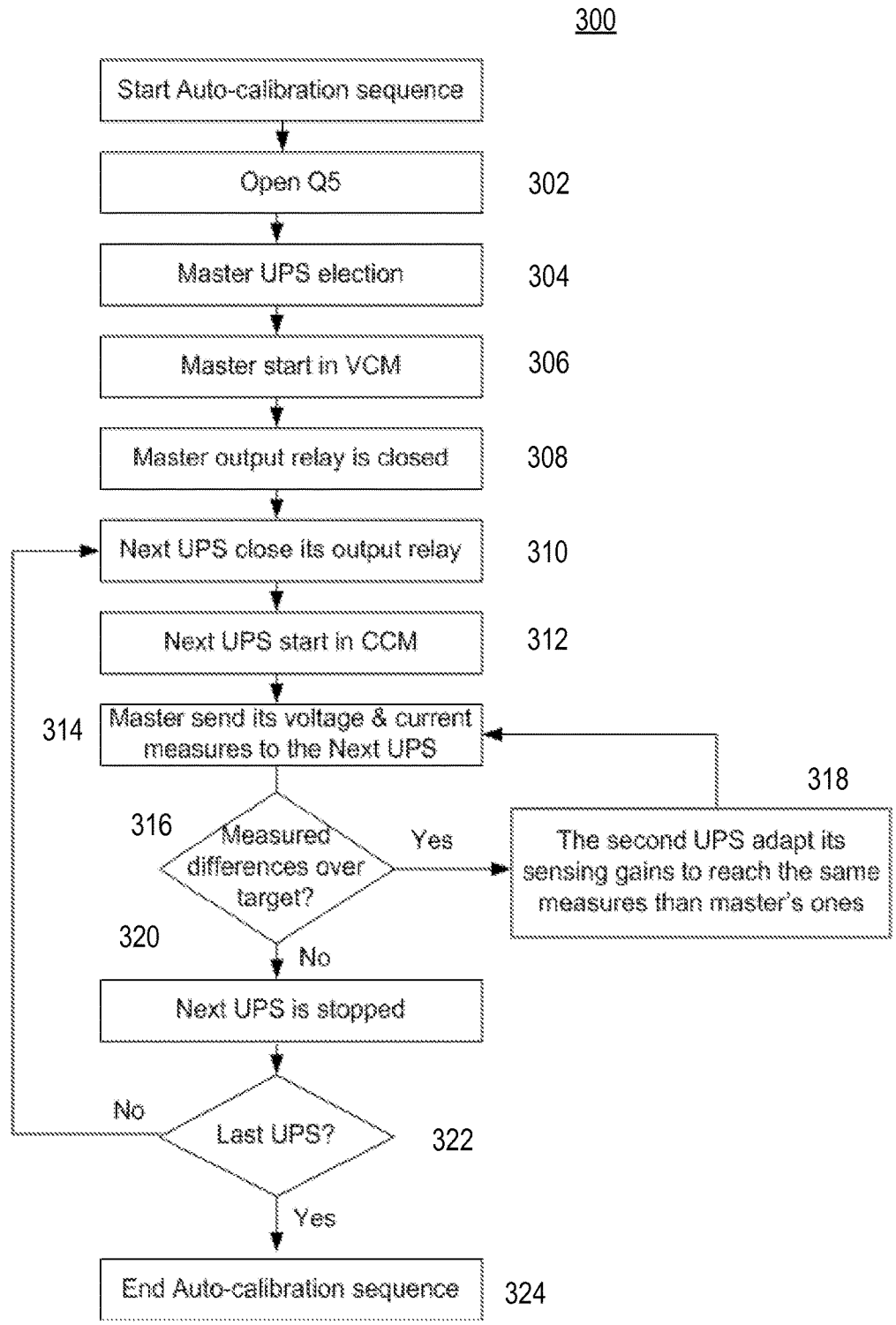
FIG. 4 is a flowchart of an automatic current calibration method in according to one embodiment of the present invention.

FIG. 4 is a flowchart of a current calibration that can be performed automatically in the UPS system 100 of FIGS. 1 to 3. Although in normal operation, each UPS is controlled to act as a voltage source, in general they are operable in other modes, including a mode in which converter 124 acts as a current source. The control mode can be changed by internal digital programming, and can be controlled from outside the unit by appropriate commands on the communication bus COM. Summarizing the two modes that are of interest for the present purpose:

Voltage Control Mode (VCM): Controller 130 generates proper commands for UPS power converters 124, in order to generate a output voltage V_out equal to a internal given voltage reference, whatever the output current i_out may be.

Current Control Mode (CCM): Controller 130 generates commands for UPS power converters, in order to generate a output current i_out equal to a internal given current reference, whatever the output V_out voltage may be.

Before supplying the load, an initialization sequence is realized by each controller and the controllers of the parallel UPS units cooperate together via bus COM. The novel auto-calibration sequence 300 of FIG. 4 is integrated in that initialization sequence and comprises steps 300-324 as follows. (Reference should also be made to the system diagram, FIG. 1.)

302: The switch Q5 is opened, if not already open.

304: One of the UPS units is elected as a master using bus COM. For example it may be UPS-1.

306, 308: The elected master UPS unit starts in voltage control mode (VCM) and closes its output relay (switch K1 in FIG. 1). At that time V_out is controlled to be equal to UPS-1's internal voltage reference.

310, 312: Then one of the other UPS units, for example UPS-2, starts in current control mode (CCM) and closes its output relay (K2). At that time V_out is still controlled to be equal to UPS-1's voltage reference, while current i_out_2 is controlled to match UPS-2's internal current reference of UPS2. The settings of switches K2 and Q5 ensure that current i_out_1 must also be equal in magnitude to current i_out_2, though opposite in direction. Therefore it is known that measurement sensors in UPS-1 and UPS-2 can now see the same output voltage and current. In a typical embodiment, the current reference, which is an AC signal, is chosen to be a pure reactive current, in order to avoid any UPS internal failure on non-reversible UPS units.

314-318: Master UPS unit will send its voltage and current measurement to the second unit (UPS-2), using bus COM. Unit UPS-2 will compare its own measurement to the master's ones, and will adapt its digital measure gains, in order to have the same measured value as master. Step 316 judges whether the measurements are close enough to be judged equal. If not, step 314 is repeated, because when UPS-2 adapts its gains the currents i_out_1 and i_out_2 will change. Several iterations could be necessary to reach an accurate calibration.

320: When UPS-2 is calibrated, it is stopped and its output relay (K2) opened.

322: A next UPS, for example USP-3 etc., starts in current control mode (CCM) and performs the same sequence 310-320 with master. This is repeated as many times as the number of UPS units in parallel. The process may be repeated if a new UPS unit is added to the system.

Other procedures may be performed in the initialization sequence, besides the one disclosed here. After initialization is complete, the UPS units are put into operation with their switches K1 etc closed as desired.

In the above example, because a pure reactive current (i.e. at 90 degrees phase relative to the voltage) is used, it does not matter that unit UPS-1 is a a reversible or non-reversible UPS. There is no net flow of current between AC/DC converters of the units, only a flow of current between DC/AC converters. The target (or threshold) referred to in the flowchart is dependent on required power sharing accuracy. Example values are 0.1% accuracy, 0.5% accuracy and 1% accuracy. The number of iterations (cycles) of the algorithm for each UPS is determined by the target—once the target is met then the iterations cease. If the target is not met in a set number of cycles then a warning can be issued and technical intervention is required.

Reversible UPS units are known, that allow current to flow into the UPS, back from output to input. These may be used, for example, when powering an elevator—current flows from the UPS to power the motor, but when elevator is required to stop the motor is operated as a generator to slow the lift and current flows back into the UPS. With non-reversible UPS units this would stop the operation of the UPS. In an embodiment where at least the master UPS is reversible, the current need not be purely reactive.

In another embodiment, the global bypass switch KBP can be used as voltage reference source, instead of placing UPS1 in VCM). Global bypass is present in existing systems to allow power to be applied to the load (albeit unprotected by a UPS) while work is undertaken on the UPS system. Sensors for measuring the voltage and current in the bypass are provided. For this embodiment, the calibration sequence begins as before by opening switch Q5. Then switch KBP is closed so that global bypass output LO-BP acts as voltage source. Then each UPS may be placed in current control mode CCM in turn and the sequence algorithm carried out as before. In this embodiment, the first UPS unit UPS-1 becomes a slave of the bypass controller (not shown in the drawing).

In another embodiment, the second UPS unit (e.g. UPS-2) may also be operated in voltage control mode (VCM), while the converter 124 of the first UPS unit (e.g. UPS-1 is off). The output capacitor Cout of UPS-1 will allow a small current to flow into UPS-1. This small current can be measured at both sides and compared in the same manner as in FIG. 4, to calibrate the current measurements between the units. The process can be repeated for the other units. It may be an advantage in some cases that there is no need for operation of a UPS unit in current control mode. However, the method is likely to be less accurate, when the current is so small.

Figure 5:
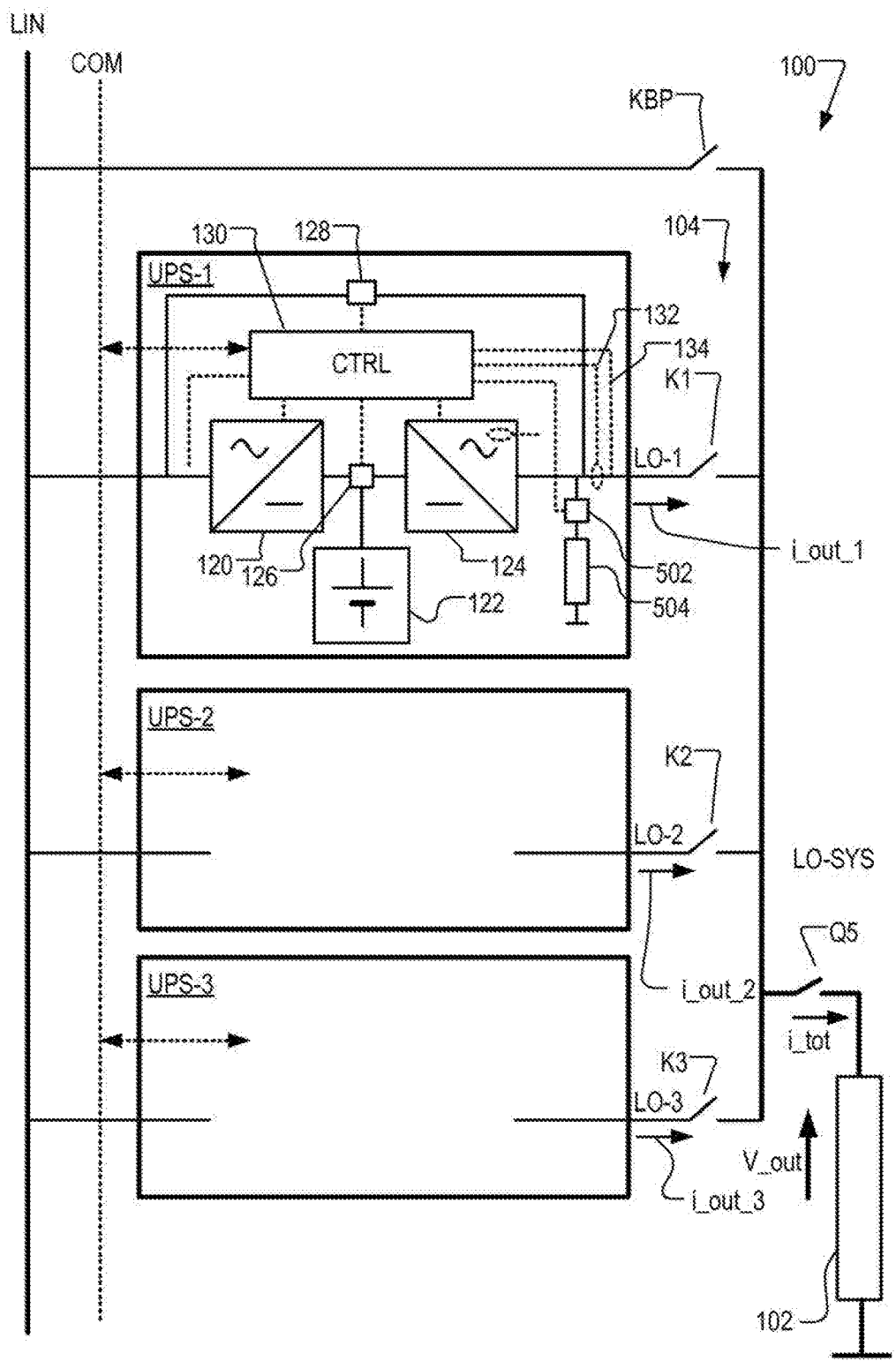
FIG. 5 is a schematic block diagram similar to FIG. 1, illustrating modified embodiments of the invention.

FIG. 5 illustrates a modification of the UPS system, adapted to provide for a more substantial current to be measured in the embodiment just described. In this system, UPS-1 (for example) has a switchable additional load, to boost the current measured. Switch 502 can be operated by controller 130 to connect a load 504 (for example a resistance) between the output of UPS-1 and ground. Then, as described in the previous paragraph, UPS-2 can be operated in voltage control mode, while the converter 124 of unit UPS-1 is off. The output voltage of UPS-2 therefore drives a current out from UPS-2 and into UPS-1, which is conveyed to ground via the switched load. This current can be measured by units UPS-1 and UPS-2, and measurements compared to obtain the desired calibration. This process can be repeated with other units if present. Note that in this modified system, there is no exchange current measuring module 136 or analog bus 138. All necessary coordination is effected through the digital communication link COM.

Another modification, applicable to all the embodiments described above, is to provide a reliability algorithm, if confidence in V_out and/or i_out measurements is not high. Measurements made by each UPS should be within certain limits of each other dependent on the analog components used, even before calibration. If the difference between the measurements is greater than a set value then the reliability algorithm can terminate the automatic calibration sequence and issue a warning.

All of the above and other modifications are within the spirit and scope of the invention as defined in the appended claims.

Implementation

The control modes and calibration sequences described herein can be implemented partly in hardware and partly in software, firmware, middleware, microcode, hardware description language or any combination thereof. For example, the invention may take the form of a program containing one or more sequences of machine-readable instructions which, when executed within controller 130, causes the controller to perform one or more methods described above. Such programming may be applied retrospectively in existing hardware designs and existing hardware already installed.

When the embodiments are implemented in software, firmware, middleware or microcode, program code or code segments, they can be stored in a machine-readable medium, such as a storage component. The term "machine-readable medium" can include, without being limited to, wireless channels and various other media capable of storing, containing, and/or carrying instruction(s) and/or data. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted using any suitable means including memory sharing, message passing, token passing, network transmission, etc.

For a software implementation, the techniques described herein can be implemented with modules (e.g., procedures, functions, and so on) that perform the functions described herein. The software codes can be stored in memory units and executed by processors. The memory unit can be implemented within the processor or external to the processor, in which case it can be communicatively coupled to the processor via various means as is known in the art.

For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. All of the processes described above may be embodied in, and fully automated via, functional code modules executed by one or more general purpose electronic devices or processors. The code modules may be stored in any type of non-transitory machine-readable medium or other storage device. Some or all of the methods may alternatively be embodied in specialized hardware. Depending on the embodiment, the non-transitory machine-readable medium may be a hard disk drive, a compact disc, a digital video disc, a tape drive or other suitable storage medium.

The invention claimed is:

1. A method for performing a current calibration procedure for a number of power supply units that are arranged for operation in parallel to supply a total electric current to a load, each power supply unit including at least one current sensor for measuring a current supplied by the unit, and a feedback controller for using the measured current during said parallel operation and controlling the unit to maintain a desired condition of supply, comprising:
   (a) operating a selected one of said power supply units as a secondary supply in parallel connection with a primary power supply, while both are disconnected from said load;
   (b) operating said current sensor in the selected power supply unit to measure current flowing in said secondary supply;
   (c) receiving information of current flowing in said primary supply measured by a primary current sensor outside the selected power supply unit; and
   (d) calibrating the current measurement in the selected power supply unit against the primary current sensor, on the basis that said current in the primary supply is equal and opposite to the current flowing in the secondary supply.

2. A method as claimed in claim 1 wherein said current calibration procedure is performed for a plurality of power supply units, each being selected in turn to operate as said secondary supply.

3. A method as claimed in claim 2 wherein said primary supply and primary current sensor are the same for all the selected power supply units.

4. A method as claimed in claim 2 wherein said current calibration procedure is performed automatically by co-operation of the controllers in the plurality of power supply units.

5. A method as claimed in claim 1 wherein for the performance of said current calibration procedure, said primary supply is one of said power supply units, operating in a voltage control mode.

6. A method as claimed in claim 1 wherein for the performance of said current calibration procedure, said primary supply is external to the secondary supply.

7. A method as claimed in claim 1 wherein for the performance of said current calibration procedure, the selected power supply unit is operated in a current control mode.

8. A method as claimed in claim 7 wherein the selected power supply unit is controlled in said current control mode to act as a pure reactance.

9. A method as claimed in claim 1 wherein performance of the calibration procedure is coordinated between units using a digital communication link which also communicates the information of the current measured by said primary current sensor to the selected power supply unit.

10. A method as claimed in claim 1 wherein each power supply unit further includes a voltage sensor for measuring an output voltage of the unit, the method further comprising a voltage calibration procedure wherein two or more of said power supply units are connected in parallel and their voltage sensors operated to obtain parallel measurements of a common output voltage.

11. A method as claimed in claim 1 wherein each of said power supply units is an uninterruptible power supply (UPS) unit, each UPS unit being connected between a mains electricity supply and said load, and each including a battery for supplying power to a DC-AC power converter in the event of failure of said mains supply.

12. An uninterruptible power supply (UPS) system comprising a plurality of UPS units connected in parallel, wherein each UPS unit comprises a controller and the controllers of the power supply units are arranged to co-operate to perform automatically the current calibration procedure as claimed in claim 1.

13. A non-transitory computer readable medium having instructions stored thereon for a controller in a power supply unit, which, when executed by the controller cause the controller to co-operate with controllers in other power supply units to perform automatically the current calibration procedure as claimed in claim 1.

14. A power supply unit suitable for operation in parallel with one or more power supply units to supply a total electric current to a load, said power supply unit comprising:
   at least one current sensor for measuring a current supplied by the unit; and
   a feedback controller for using the measured current during said parallel operation and for controlling the unit to maintain a desired condition of supply, wherein said controller is further arranged to perform a current calibration procedure performed prior to said parallel operation by:
   (a) operating the power supply unit as a secondary supply in parallel connection with a primary power supply external to the power supply unit, while both are disconnected from said load;
   (b) operating said current sensor in the power supply unit to measure current flowing in said secondary supply;
   (c) receiving information of current flowing in said primary supply measured by a primary current sensor outside the power supply unit; and
   (d) calibrating the current measured in the power supply unit against the primary current sensor, on the basis that said current in the primary supply is equal and opposite to the current flowing in the secondary supply.

15. A power supply unit as claimed in claim 14 wherein said controller is arranged to perform the current calibration procedure for itself and then to disconnect itself from said primary supply while the current calibration procedure is performed for a plurality of other power supply units, each being selected in turn to operate as said secondary supply.

16. A power supply unit as claimed in claim 14 wherein for the performance of said current calibration procedure, the power supply unit is operated in a current control mode.

17. A power supply unit as claimed in claim 16 wherein the power supply unit is controlled in said current control mode to act as a pure reactance.

18. A power supply unit as claimed in claim 14 wherein said controller is arranged to perform said current calibration procedure automatically by cooperation with similar controllers in a plurality of power supply units.

19. A power supply unit as claimed in claim 18 wherein performance of the current calibration procedure is coordinated between units using a digital communication link which also communicates the information of the current measured by said primary current sensor to the power supply unit.

20. A power supply unit as claimed in claim 14 wherein said power supply unit is an uninterruptible power supply (UPS) unit adapted for connection between a mains electricity supply and said load, said power supply unit including a battery for supplying power in the event of failure of said mains supply.

21. An uninterruptible power supply (UPS) system comprising a plurality of UPS units connected in parallel, wherein each UPS unit comprises a power supply unit as claimed in claim 14.

* * * * *